United States Patent
Pu et al.

(10) Patent No.: US 8,302,048 B2
(45) Date of Patent: Oct. 30, 2012

(54) METHOD AND APPARATUS FOR DETECTING CONTRADICTORY TIMING CONSTRAINT CONFLICTS

(75) Inventors: Suo Ming Pu, Shanghai (CN); Hong Hua Song, Beijing (CN); Hong Wei Dai, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 12/767,068

(22) Filed: Apr. 26, 2010

(65) Prior Publication Data

US 2010/0281447 A1 Nov. 4, 2010

(30) Foreign Application Priority Data

Apr. 30, 2009 (CN) .......................... 2009 1 0136969

(51) Int. Cl.
*G06F 17/50* (2006.01)
*G06F 9/455* (2006.01)
(52) U.S. Cl. .................... 716/108; 716/113; 716/134
(58) Field of Classification Search .................. 716/108, 716/113, 134

See application file for complete search history.

(56) References Cited

U.S. PATENT DOCUMENTS

| | | | | |
|---|---|---|---|---|
| 5,457,638 A * | 10/1995 | Ashar et al. | ...... | 716/108 |
| 5,561,790 A * | 10/1996 | Fusaro | ...... | 703/26 |
| 5,663,891 A * | 9/1997 | Bamji et al. | ...... | 716/122 |
| 6,321,362 B1 * | 11/2001 | Conn et al. | ...... | 716/108 |
| 6,363,520 B1 * | 3/2002 | Boubezari et al. | ...... | 716/103 |
| 6,826,733 B2 * | 11/2004 | Hathaway et al. | ...... | 716/134 |
| 6,836,753 B1 * | 12/2004 | Silve | ...... | 703/2 |
| 7,555,740 B2 * | 6/2009 | Buck et al. | ...... | 716/134 |
| 7,584,443 B1 * | 9/2009 | Govig et al. | ...... | 716/113 |
| 7,698,674 B2 * | 4/2010 | Kalafala et al. | ...... | 716/113 |
| 7,814,452 B1 * | 10/2010 | Jang et al. | ...... | 716/100 |
| 7,849,429 B2 * | 12/2010 | Hemmett et al. | ...... | 716/113 |
| 2004/0230921 A1 * | 11/2004 | Hathaway et al. | ...... | 716/2 |
| 2005/0108665 A1 * | 5/2005 | Neves et al. | ...... | 716/2 |
| 2005/0198601 A1 * | 9/2005 | Kuang et al. | ...... | 716/6 |
| 2006/0190884 A1 * | 8/2006 | Nishida | ...... | 716/6 |
| 2008/0134117 A1 * | 6/2008 | Kalafala et al. | ...... | 716/6 |
| 2008/0209373 A1 * | 8/2008 | Buck et al. | ...... | 716/6 |
| 2009/0119632 A1 * | 5/2009 | Kano et al. | ...... | 716/10 |
| 2009/0241078 A1 * | 9/2009 | Hemmett et al. | ...... | 716/6 |

(Continued)

OTHER PUBLICATIONS

Dasden, A, A strongly polynomial-time algorithm for over-constraint resolution [Efficient debugging of Timing Constraint Violations], May 2002. ACM. pp. 127, 132.*

*Primary Examiner* — Stacy Whitmore
(74) *Attorney, Agent, or Firm* — Wenjie Li

(57) ABSTRACT

The present invention discloses a method and apparatus for detecting timing constraint conflicts, the method comprising: receiving a timing constraint file; taking all test points in the timing constraint file as nodes, determining directed edges between the nodes and weights of the directed edges according to timing constraints relevant to the test points in the timing constraint file to establish a directed graph; searching for all directed cycles of the directed graph; and for each directed cycle, if the sum of the weights of the directed edges constituting the directed cycle satisfies a required condition, determining that a timing constraint conflict exists among the test points and the timing constraints constituting the directed cycle. The method and apparatus can automatically detect timing constraint conflicts with one hundred percent to reduce design turnaround time and engineer resources in ASIC projects.

16 Claims, 6 Drawing Sheets

U.S. PATENT DOCUMENTS

| | | | |
|---|---|---|---|
| 2009/0249270 A1* | 10/2009 | Buck et al. | 716/6 |
| 2009/0265674 A1* | 10/2009 | Buck et al. | 716/6 |
| 2010/0042955 A1* | 2/2010 | Kotecha et al. | 716/2 |
| 2010/0180243 A1* | 7/2010 | Sinha et al. | 716/6 |
| 2010/0180244 A1* | 7/2010 | Kalafala et al. | 716/6 |
| 2010/0313177 A1* | 12/2010 | Zhang et al. | 716/108 |

* cited by examiner

METHOD AND APPARATUS FOR DETECTING CONTRADICTORY TIMING CONSTRAINT CONFLICTS

CROSS-REFERENCE TO RELATED APPLICATION

This present application claims priority of a Chinese patent application S/N 200910136969.0 filed Apr. 30, 2009.

FIELD OF THE INVENTION

The present invention relates to the technical field of application-specific integrated circuit design, and more specifically, to a method and apparatus for detecting timing constraint conflicts in application-specific integrated circuit design.

BACKGROUND OF THE INVENTION

ASIC (Application-Specific Integrated Circuit) design can be divided into front end design and back end design, wherein the front end design personnel output netlist files and timing constraint files according to design requirement documents. A netlist file describes various devices used in chip design and logical connection relationships among the devices, but do not describe how the various devices are physically placed; a timing constraint file is used for specifying the amount of time by which a data signal (and/or a clock signal) needs to arrive in advance or in retard relative to a clock signal (and/or a data signal). Accordingly, time delays of respective circuits in a circuit are prescribed. According to the netlist files and the timing constraint files output by the front end design personnel, the back end design personnel perform layout wiring on netlist level design, which are transformed into layout design composed of standard cells, macrocells and pads, wherein a standard cell library is a library composed of certain basic logical gate circuits, and each cell has same layout height and has a variety of different views; a macrocell comprises a RAM, a ROM and a dedicated IP module; a pad comprises input, output and power supply pad. One important task of the design by the back end design personnel is to satisfy timing constraints required in timing constraint files.

Therefore, timing constraint is one important factor in ASIC design requirement, and a timing constraint conflict means that contradictory timing constraint requirements are made for a same circuit. For example, constraint 1 requires that signal A arrives earlier than signal B, constraint 2 requires that signal A arrives later than signal B, then for signal A, a timing constraint conflict exists. Apparently, if a conflict exists between timing constraints, it is impossible to meet design requirements. However, due to different reasons, the problem of timing constraint conflict exists nearly in all of chip designs.

Currently, in order to detect whether or not timing constraints in timing constraint files can be satisfied, the design personnel usually adopt a STA method (static timing analysis method). Static timing analysis uses indiscriminately a specific timing model, and with respect to a specific circuit, analyzes whether it violates the timing constraints given by a designer. The inputs of a static timing analysis tool are as follows: a netlist, timing constraints and a timing model. A static timing analysis tool implements certain functions to help a user conduct a timing analysis, and main tools in the industry are PrimeTime of Sysnopsys and ETS (Encounter Timing System) of Cadence. During a STA process, in order to detect conflicting timing constraints, there is a need to manually analyze timing report, and debug erroneous timing constraints. However, a timing constraint report of present day ASIC design contains entries varying from 10,000 to 100,000 lines, and debugging work will cost static timing analysis engineers a significant amount of time (several days to several weeks). It will also take ASIC timing-driven layout tools a large amount of time to achieve these goals. If timing constraint conflicts exist in a timing constraint file itself, this design goal is almost impossible. In actual ASIC design, delays in delivery often occur due to this reason. Therefore, if timing constraint conflicts can be acquired in an early stage, design turnaround time in design will be significantly reduced.

Among the existing different STA tools, IBM Einstimer tool provides the following function: if UDT (User Defined Test) and RAT (Required Arrival Time) exist at a same port, a warning message is provided. The function only aims at port and cannot be applied to internal logic, and a warning is given only when the above two tests overlap. If timing constraint of the internal logic conflicts with each other, the tool does not have detecting function. Other STA tools do not even have relevant functions.

Another drawback of the above solution is: for a timing report having 10,000 to 100,000 lines, it is quite difficult to achieve the goal of 100% detecting and covering all the timing constraint conflicts merely by manual work, timing constraint debugging efficiency will be very low.

SUMMARY OF THE INVENTION

Therefore, there is a need for a method that can automatically detect timing constraint conflicts with 100% coverage to reduce design turnaround time and engineer resources in ASIC projects.

According to one aspect of the present invention, there is provided a method for detecting timing constraint conflicts, comprising: receiving a timing constraint file; taking all test points in the timing constraint file as nodes, determining directed edges between the nodes and weights of the directed edges according to timing constraints relevant to the test points in the timing constraint file to establish a directed graph; searching for all directed cycles of the directed graph; for each directed cycle, if the sum of the weights of the directed edges constituting the directed cycle satisfies a required condition, determining that a timing constraint conflict exists among the test points and the timing constraints constituting the directed cycle.

According to another aspect of the present invention, there is provided an apparatus for detecting timing constraint conflicts, comprising: a receiving module for receiving a timing constraint file; an establishing module for, taking all test points in the timing constraint file as nodes, determining directed edges between the nodes and weights of the directed edges according to timing constraints relevant to the test points in the timing constraint file to establish a directed graph; a searching module for searching for all directed cycles of the directed graph; a determining module for, for each directed cycle, if the sum of the weights of the directed edges constituting the directed cycle satisfies a required condition, determining that a timing constraint conflict exists among the test points and the timing constraints constituting the directed cycle.

BRIEF DESCRIPTION OF THE DRAWINGS

The above and other objectives, features and advantages of the present invention will become more apparent from more detailed description of the exemplary implementation of the present invention in the drawings, wherein, like reference numbers generally represent same parts in the exemplary implementation of the present invention.

DETAILED DESCRIPTION OF PREFERRED EMBODIMENTS

The preferred implementation of the present invention will be described in more detail with reference to the figures, in which preferred embodiments of the present invention are shown. However, the present invention can be implemented in various forms, and shall not be construed as being limited by the embodiments set forth herein. On the contrary, these embodiments are provided to make the present invention more thorough and complete, and, to fully convey the scope of the present invention to a person skilled in the art.

For a better understanding of the present invention, certain basic concepts are first given herein:

(1) MRTA (Minimum Required Time Advanced): if the arrival time ($AT_A$) of a signal at point A is at least later than the arrival time ($AT_B$) of the signal at point B by X, namely $$AT_A - AT_B \geq X \tag{1}$$

then, for the arrival of the signal at point B, X is the Minimum Required Time Advanced.

(2) Each point in a circuit has different time detection types, which include early mode signal arrival time and late mode signal arrival time, wherein, the early mode signal arrival time gives the earliest signal arrival time at the point, and the late mode signal arrival time gives the latest signal arrival time at the point. In a directed graph, two nodes are used to express such node that has different time detection types.

Figure 1:
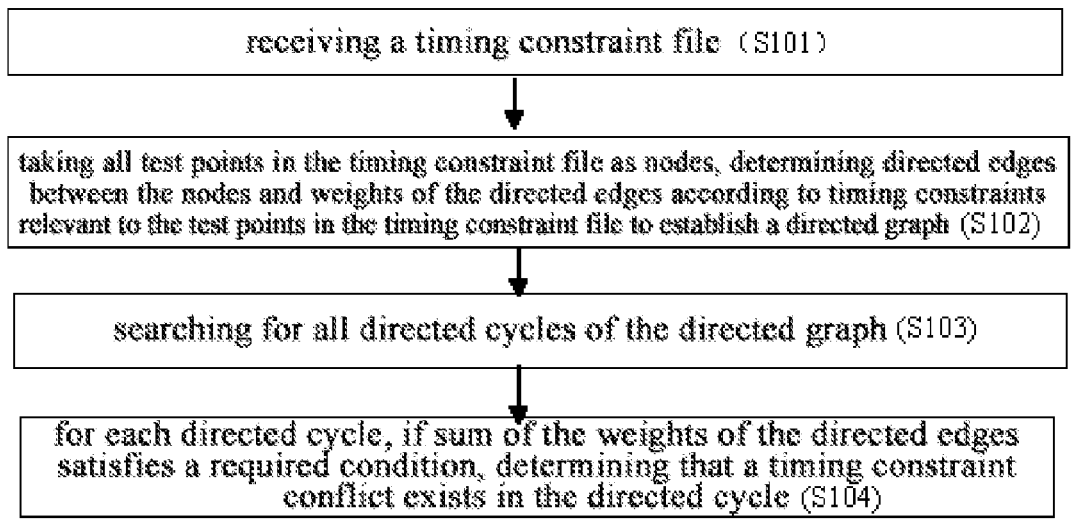
FIG. 1 schematically shows a flowchart of a method for detecting timing constraint conflicts according to the present invention.

FIG. 1 schematically shows a flowchart of a method for detecting timing constraint conflicts according to the present invention. Here, a basic outline of the flow is given first, and then, the implementation methods of respective steps will be detailed. First at step S101, a timing constraint file is received; the timing constraint file gives timing constraints of timing test points. Then, at step S102, all the test points in the timing constraint file are taken as nodes, and directed edges between the nodes and weights of the directed edges are determined according to timing constraints relevant to the test points in the timing constraint file to establish a directed graph. As to how to establish a directed graph is omitted here and it will be described in detail in the latter part. At step S103, all directed cycles of the directed graph are sought, and finally at step S104, for each directed cycle, if the sum of the weights of the directed edges constituting the directed cycle satisfies a required condition, it is determined that a timing constraint conflict exists among the test points and timing constraints constituting the directed cycle. The method preferably also comprises outputting the test points and timing constraints constituting the directed cycle among which the timing constraint conflict exists. They may be output in various ways including but not limited to files, printer output, graphical user interface output and the like.

At step S102, when all the test points in the timing constraint file are taken as nodes, and directed edges between the nodes and weights of the directed edges are determined according to timing constraints relevant to the test points in the timing constraint file to establish a directed graph, a plurality of steps are comprised, which are discussed in detail as follows.

Figure 2:
FIG. 2 gives a directed graph representation of the Minimum Required Time Advanced (MRTA) concept.

The directed graph here comprises nodes, directed edges and weights of the directed edges. FIG. 2 gives a directed graph representation of Minimum Required Time Advanced (MRTA) concept. MRTA is weight of the directed edge from node B to node A, i.e. weight of a directed edge is the Minimum Required Time Advanced MRTA of signal arrival of two nodes connected by that directed edge. Generally, it is deduced from data in a netlist and data in a timing constraint file. In the graph, if the direction of the directed edge points to a node at which signal arrives at a late time, then MRTA>0. Apparently the direction of the directed edge may also be changed to point from B to A, and then MRTA<0. These two kinds of directed graphs are both permissible; however, in one directed graph, only one manner can be adopted, i.e. either directions of all the directed edges all point to late nodes, or all point to early nodes. The following is described by taking the case where directions of directed edges all point to late nodes as an example.

Figure 3:
FIG. 3 shows a directed graph of a node having different timing detection types when MRTA=0.

In addition, one point in a circuit may have different timing detection types, and although there is only one node, it can also be expressed herein as a directed graph. FIG. 3 shows a directed graph of a node having different timing detection types when MRTA=0. Here, two nodes of a directed graph are used to express different timing detection types of one node in a circuit.

Figure 4A:
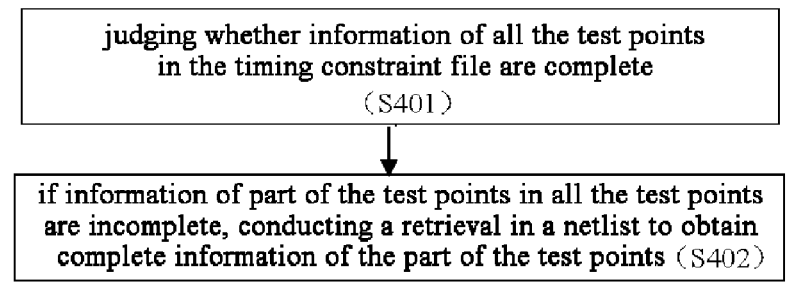
FIG. 4a schematically shows a flow of searching a netlist for incomplete test point information according to an embodiment of the present invention.

The timing constraints given by a timing constraint file essentially contain test point information; however, in many cases, test point information is incomplete. For example, a timing constraint is given by wildcard: reg[*]/D, wherein, * represents any character. And at this time, a netlist is necessarily needed to completely parse all test points, the netlist describes various devices used in design and logical connection relationships among the devices, and only by searching the netlist, can one know how many devices conform to this matching condition, e.g. if the netlist has therein reg[0]~ reg[20] that conform to the condition, a search result will be obtained. Therefore, FIG. 4a schematically shows a flow of searching a netlist for incomplete test point information according to an embodiment of the present invention. In response to the requirement of taking all the test points in the timing constraint file as nodes, first at step S401, it is judged whether information of all the test points in the timing constraint file are complete; if information of part of the test points in all the test points are incomplete, at step S402, a retrieval is conducted in the netlist to obtain complete information of the part of the test points. In this manner, complete test point information is obtained, whereby all nodes of a directed graph can be established.

Figure 4B:
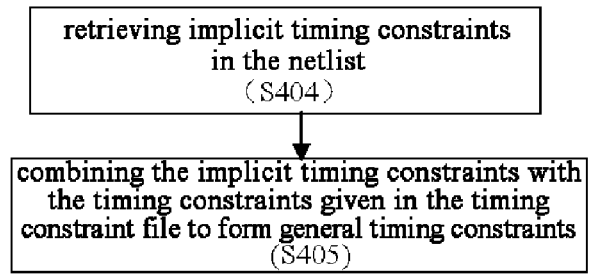
FIG. 4b gives a method for obtaining general timing constraints according to an embodiment of the present invention.

In addition, some timing constraints are implicit timing constraints, which are brought by the devices used, and such implicit timing constraints must also be checked; the implicit timing constraints are not given in the timing constraint file, but are given in device library of a netlist. At this time, it is also necessary to query library file in the netlist to obtain implicit timing constraints of the devices, the implicit timing constraints are combined with the timing constraints given in the timing constraint file to constitute general timing constraints, so as to establish a timing constraint directed graph. The general timing constraints comprise at least one of the implicit timing constraints and the timing constraints given in the timing constraint file. To combine the implicit timing constraints with the timing constraints given in the timing constraint file, as a matter of fact, is to simply put timing constraints thereof together. For example, if the implicit timing constraints comprise constraints (1) and (2), and the timing constraints given in the timing constraint file comprise constraints (3) and (4), then, the general timing constraints comprise constraints (1), (2), (3) and (4). FIG. 4b gives a method for obtaining general timing constraints according to an embodiment of the present invention, first at step S404, implicit timing constraints are retrieved in a netlist, which implicit timing constraints are defined by devices used in the netlist and are not given in a timing constraint file; then at step S405, the implicit timing constraints are combined with the timing constraints given in the timing constraint file to constitute general timing constraints.

Figure 4C:
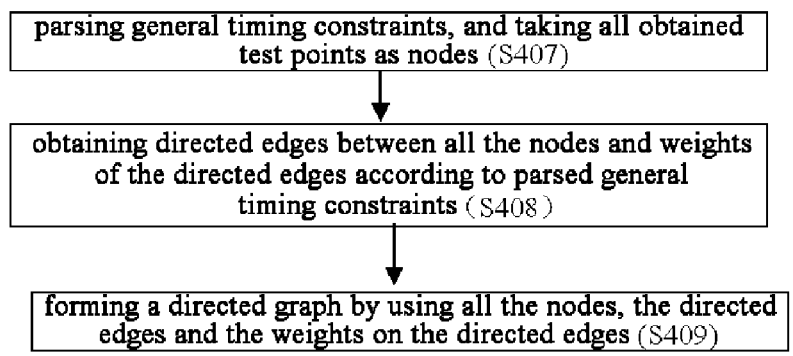
FIG. 4c schematically shows a flow of establishing a directed graph according to an embodiment of the present invention.

FIG. 4c schematically shows a flow of establishing a directed graph according to an embodiment of the present invention. At step S407, general timing constraints are parsed, and all the obtained test points are taken as nodes, wherein the general timing constraints comprise at least one of the implicit timing constraints and the timing constraints given in the timing constraint file; at step S408, according to the parsed general timing constraints, directed edges between all the nodes and weights of the directed edges are obtained; at step S409, all the nodes, directed edges and weights on the directed edges are used to constitute a directed graph.

Next, the process of establishing a directed graph is described by means of some examples.

Figure 5A:
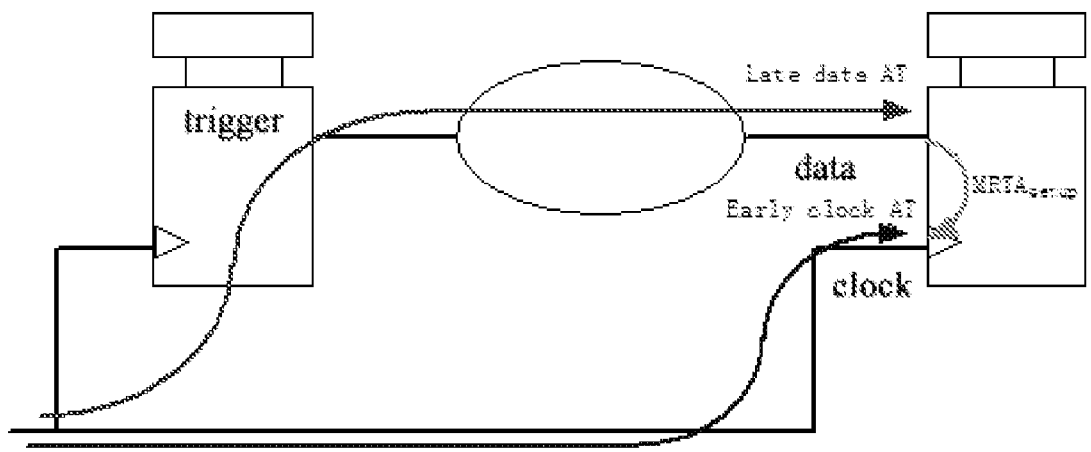
FIGS. 5a and 5b give netlists of a trigger setup check and a trigger hold check, respectively.
Figure 5B:
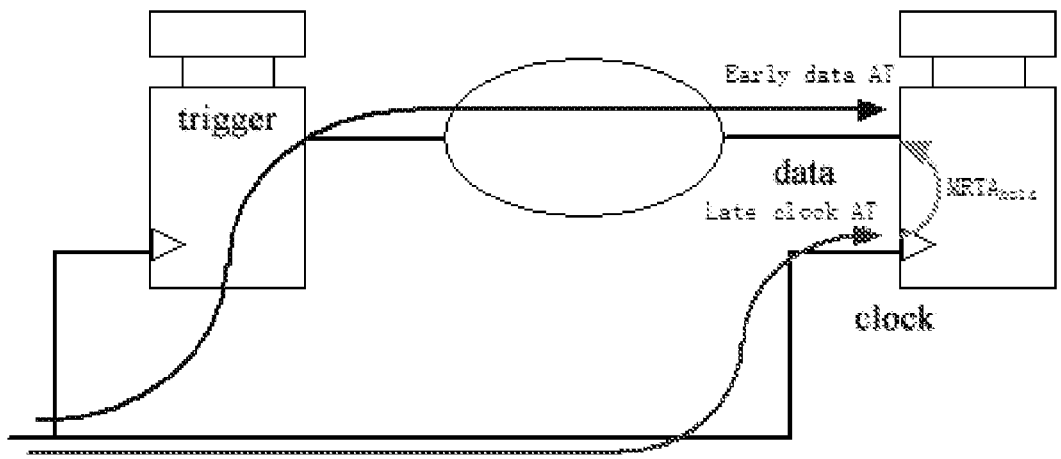

Example 1 gives an implicit timing constraint. FIGS. 5a and 5b give netlists of a trigger setup check and a trigger hold check, respectively. Here, there is no timing constraint file. The trigger comprises two checkpoints, namely a data point and a clock point, which constitute nodes of the directed graph. According to FIG. 5a, in the setup check, it is required that the latest data arrival time (LateDataAT) is earlier than the earliest clock arrival time EarlyClockAT) by (MRTA$_{setup}$=ClockJitter+SetupGuardTime−ClockPeriod), wherein, ClockJitter is the clock jitter; SetupGuardTime is a time parameter decided by device; ClockPeriod is the clock period; according to FIG. 5b, in the hold check, it is required that the latest clock arrival time (LateClockAT) is earlier than the earliest data arrival time by MRTA$_{hold}$ (MRTA$_{hold}$=HoldGuardTime), wherein, HoldGuardTime is also a time parameter decided by device. Accordingly, the implicit timing constraint of the device can be parsed as follows:

$$LateDataAT \leq EarlyClockAT+ClockPeriod-ClockJitter- \\ SetupGuardTime\ EarlyClockAT-LateDataAT \geq \\ ClockJitter+SetupGuardTime- \\ ClockPeriod=MRTA_{setup} \quad (2)$$

$$EarlyDataAT \geq LateClockAT+HoldGuardTime\ Early- \\ DataAT-LateClockAT \geq \\ HoldGuardTime=MTRA_{hold} \quad (3).$$

The parsing of a timing constraint can either be completed by STA tools, or implemented by independent programming.

Figure 6:
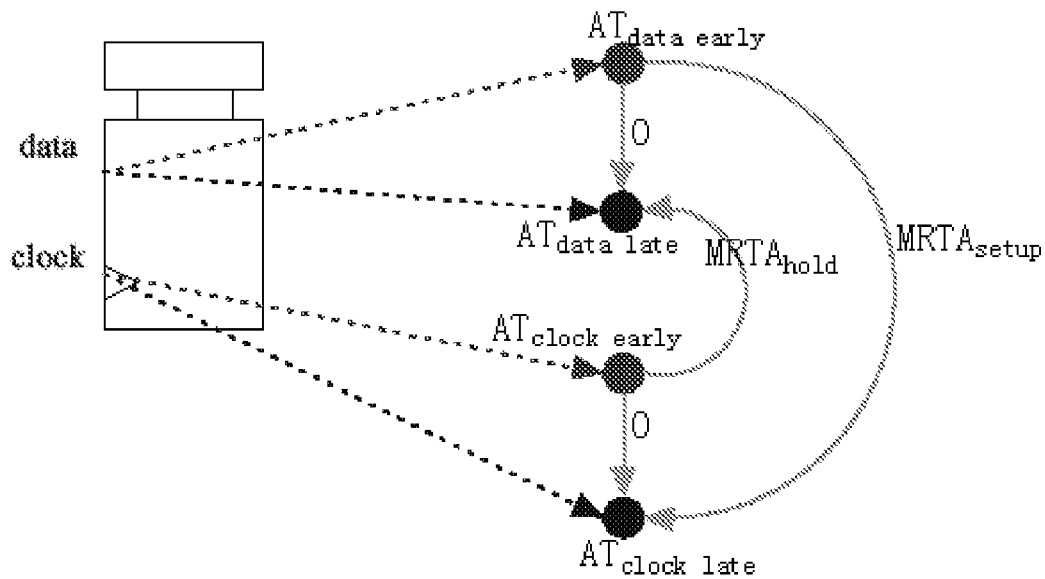
FIG. 6 shows a directed graph obtained according to the netlists and timing constraint relationships as shown in FIG. 5.

According to the parsed implicit timing constraint, it can be known that two nodes, namely a data node and a clock node, are comprised. Since each node has two timing detection types, the directed graph comprises therein four nodes. FIG. 6 shows a directed graph obtained according to the netlists and timing constraint relationships of FIG. 5. Apparently it is a directed cycle.

Figure 7:
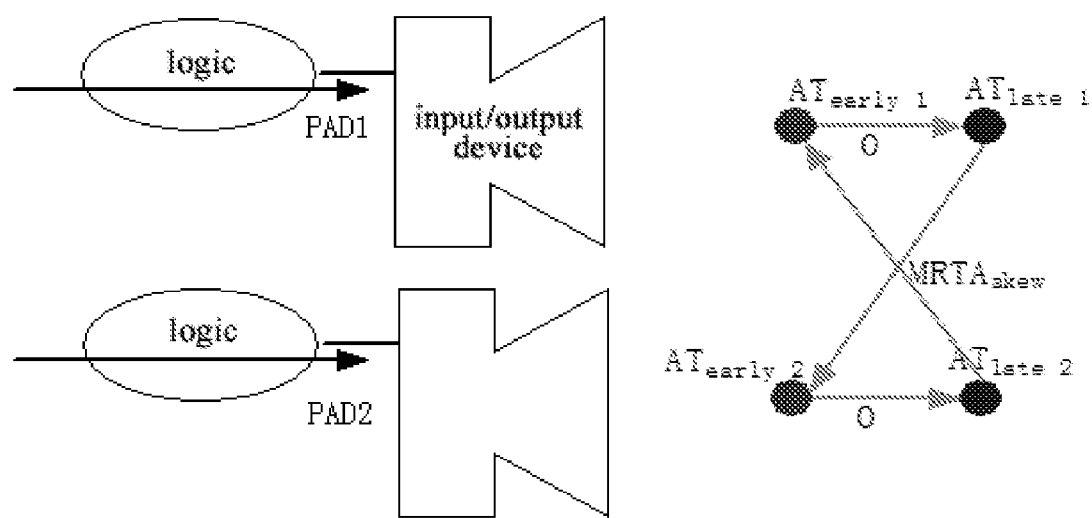
FIG. 7 shows a netlist and a directed graph of user-defined skew detection.

Example 2 gives a directed graph establishing process for a user-defined skew detection. FIG. 7 shows a netlist and a directed graph of the user-defined skew detection. According to the netlist, the circuit has therein two input/output devices that are connected to some logics, and two connection points which are test points, namely PAD1 and PAD2. However, since each point has two timing detection types, the directed graph has four nodes. The content of the timing constraint file is as follows:

set_skew_test-pins {PAD1/A PAD2/A}-min Skew-
       Guard, which means that signal arrival time of pin PAD1 and pin PAD2 of the device is within the range of SkewGuard. Here, the timing constraint file does not contain incomplete information; in addition, the devices in the netlist also do not contain implicit timing constraints. The parsing result can be expressed as follows:

$$AT_{late1}-SkewGuard \leq AT_{early2}\ AT_{early2}- \\ AT_{late1} \geq -SkewGuard=MRTA_{skew} \quad (4)$$

$$AT_{late2}-SkewGuard \leq AT_{early1}\ AT_{early1}- \\ AT_{late2} \geq -SkewGuard=MRTA_{skew} \quad (5).$$

The directed graph established according to nodes, directed edges in the timing constraints and weights of the directed edges is shown at right side of FIG. 7.

Figure 8:
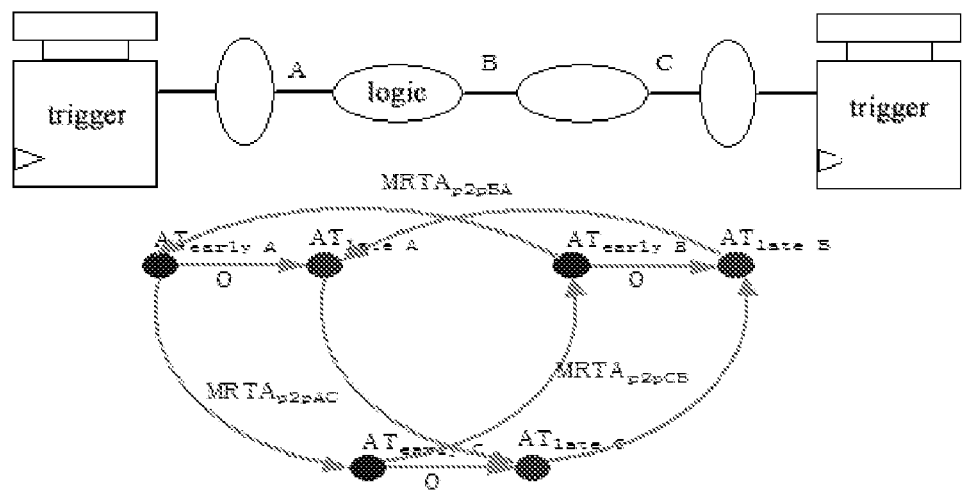
FIG. 8 shows a netlist and a directed graph of point-to-point delay detection.

Example 3 gives a directed graph establishing process for a point-to-point delay detection. The point-to-point delay detection is used for controlling the delay between two points in chip design, and is widely used in asynchronous interface logic. FIG. 8 shows a netlist and a directed graph of the point-to-point delay detection. In the netlist as shown in FIG. 8, two triggers are connected to each other by means of some logics, and the connection points are the test points. According to the netlist at the upper portion of FIG. 8, there are three test points, namely A, B and C; however, since each point has two timing detection types, the directed graph has six nodes. The content of the timing constraint file is as follows:

set_point_to_point_delay-from      A-to      B-max
       P2PGuard_AB
    set_point_to_point_delay-from      B-to      C-max
       P2PGuard_BC
    set_point_to_point_delay-from      A-to      C-min
       P2PGuard_AC which means that the maximum delay from point A to point B is P2PGuard_AB, the maximum delay from point B to point C is P2PGuard_BC, and the maximum delay from point A to point C is P2PGuard_AC. Here, the timing constraint file does not contain incomplete information; in addition, the devices in the netlist do not contain implicit timing constraints. The parsing result can be expressed as follows:

$$AT_{earlyB} - \text{P2PGuard\_AB} \leq AT_{earlyA} \; AT_{earlyA} - AT_{earlyB} \geq -\text{P2PGuard\_AB} = \text{MRTA}_{p2pBA} \quad (6)$$

$$AT_{earlyC} - \text{P2PGuard\_BC} \leq AT_{earlyB} \; AT_{earlyB} - AT_{earlyC} \geq -\text{P2PGuard\_BC} = \text{MRTA}_{p2pCB} \quad (7)$$

$$AT_{earlyC} - AT_{earlyA} \geq \text{P2PGuard\_AC} = \text{MRTA}_{p2pAC} \quad (8).$$

The directed graph established according to nodes, directed edges in the timing constraints and weights of the directed edges is shown at lower side of FIG. 8.

After the directed graph is established, it is necessary to search for all directed cycles of the directed graph. There are a variety of ways to search for directed cycles in a directed graph.

One method that is widely used is to first search for all strongly connected components, and then searches the sought strongly connected components for directed cycles. A strongly connected component refers to a part in a directed graph where any two nodes can reach each other. In graph theory technology, there are many algorithms to search for strongly connected components, such as depth-first search algorithm, Kosaraju-Sharir algorithm and the like. Next, the flow of depth-first search algorithm is given.

(1) On directed graph G, starting from one vertex, a depth-first search traversal is performed along an arc whose tail is the vertex, and the vertexes are arranged according to the order in which searches of all of their neighboring points are all completed. The algorithm steps for deriving strongly connected branches of the directed graph G are as follows:
  1) a depth-first search is performed on G and according to the sequence in which recursive calls are completed, respective vertexes are numbered;
  2) the direction of each edge of G is changed to construct a new directed graph Gr;
  3) according to vertex numbers determined in 1), starting from the vertex with largest number, a depth-first search is performed on Gr. If not all the vertexes of Gr are visited during the search process, the vertex with largest number is chosen from the vertexes that have not been visited, and starting from that vertex, the depth-first search is continued;
  4) in the finally obtained depth-first spanning forest of Gr, the vertexes on each tree constitute one strongly connected branch of G.

The above is merely an exemplary description, and it can be recognized by a person skilled in the art that any algorithm for searching for a strongly connected region of a directed graph can be used here.

After strongly connected region of a directed graph is found, algorithms in graph theory can be used to search for directed cycles in the strongly connected region. For example, Dijkstra algorithm, FLOYD algorithm and the like can be adopted, and for FLOYD algorithm, code description is available at http://www.zjtg.cn/itjs/suanfa/2_4.asp.

Here, description is still given by taking figures as examples.

Figures 9, 10:
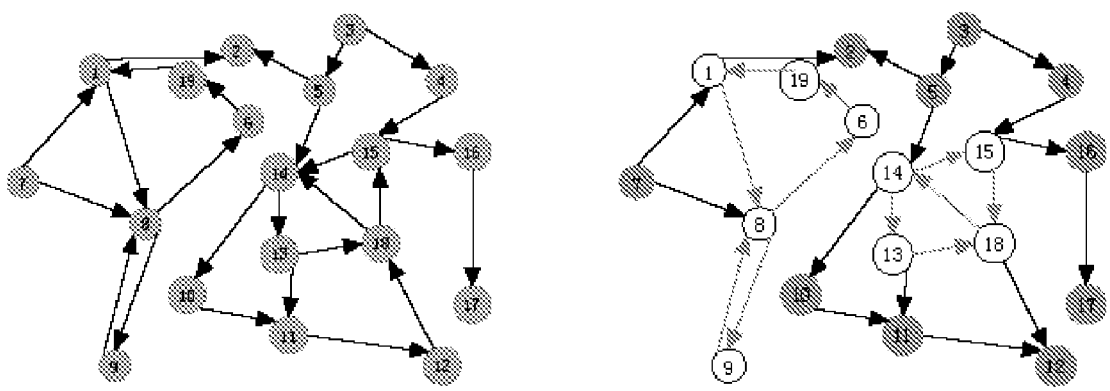
FIG. 9 schematically shows a directed graph obtained according to a netlist file and a timing constraint file.
FIG. 10 schematically shows result of searching the directed graph of FIG. 9 for a strongly connected region.
Figure 11:
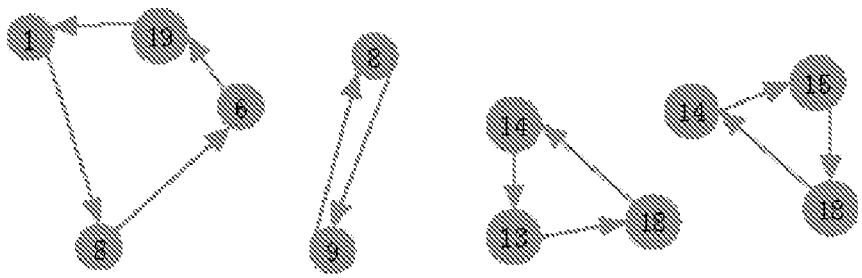
FIG. 11 schematically shows result of searching the strongly connected region of FIG. 10 for directed cycles.

FIG. 9 schematically shows a directed graph obtained according to netlist file and timing constraint file. FIG. 10 schematically shows result of searching the directed graph of FIG. 9 for a strongly connected region. FIG. 11 schematically shows result of searching the strongly connected region of FIG. 10 for directed cycles.

It can be appreciated by a person skilled in the art that the object of searching for strongly connected region is to search for directed cycles. Algorithms in graph theory that do not search for a strongly connected region, but directly search for directed cycles can be directly applied to the present invention.

At final step S104, for each directed cycle, if sum of the weights of the directed edges constituting the directed cycle satisfies a required condition, it is determined that a timing constraint conflict exists among the test points and timing constraints constituting the directed cycle. Specifically, if directions of all the directed edges of the directed graph point to nodes at which signal arrives at a late time, then MRTA>0, and the condition required to be satisfied by the sum of the weights of the directed edges constituting the directed cycle is that the sum of the weights is larger than 0. Of course, if directions of the directed edges are made to point to nodes at which signal arrives at an early time, then MRTA<0, and the condition required to be satisfied by the sum of the weights of the directed edges constituting the directed cycle is that the sum of the weights is smaller than 0.

In this manner, relevant test points and timing constraints can be determined according to directed cycles constituted by the directed edges whose sums of the weights satisfy the condition, and these timing constraints are conflicting timing constraints.

It can be seen from the above description that the present invention can perform automatic detection purely in software, free engineers from complex manual work, and enhance detection efficiency, whereby 100% detection of conflicting timing constraints can be achieved.

Figure 12:
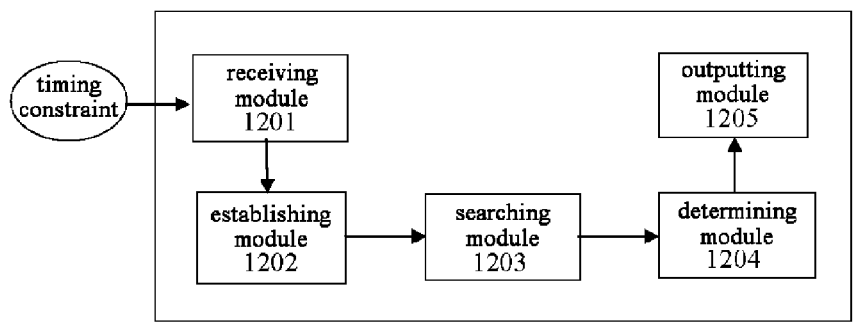
FIG. 12 schematically shows an apparatus for detecting timing constraint conflicts.

Based on a same inventive concept, the present invention also discloses an apparatus for detecting timing constraint conflicts, and as shown in FIG. 12, the apparatus comprises: a receiving module 1201 for receiving a timing constraint file; an establishing module 1202 for, taking all test points in the timing constraint file as nodes, determining directed edges between the nodes and weights of the directed edges according to timing constraints relevant to the test points in the timing constraint file to establish a directed graph; a searching module 1203 for searching for all directed cycles of the directed graph; a determining module 1204 for, for each directed cycle, if sum of the weights of the directed edges constituting the directed cycle satisfies a required condition, determining that a timing constraint conflict exists among the test points and timing constraints constituting the directed cycle. Preferably, the apparatus further comprises an outputting module 1205 for outputting the test points and timing constraints constituting the directed cycle among which the timing constraint conflict exists.

According to one implementation of the present invention, the establishing module 1202 comprises (not shown in the figure): a judging module for judging whether information of all the test points in the timing constraint file are complete; a netlist retrieval module for, if information of part of the test points in all the test points are incomplete, conducting a retrieval in the netlist to obtain complete information of the part of the test points.

According to another implementation of the present invention, the establishing module 1202 comprises (not shown in the figure): a parsing module for parsing general timing constraints, and taking all obtained test points as nodes, wherein the general timing constraints comprise at least one of implicit timing constraints and timing constraints given in the timing constraint file; a directed edge and weight establishing module for obtaining directed edges between all the nodes and weights of the directed edges according to parsed general timing constraints; a directed graph establishing module for forming a directed graph by using all the nodes, the directed edges and the weights on the directed edges.

According to a further implementation of the present invention, the parsing module comprises (not shown in the figure): a netlist retrieval module for retrieving implicit timing constraints in the netlist, the implicit timing constraints are defined by devices used in the netlist and are not given in the timing constraint file; a combining module for combining the implicit timing constraints with the timing constraints given in the timing constraint file to form general timing constraints.

According to one implementation of the present invention, if the directed edges point to nodes at which signal arrives at a late time, the condition required to be satisfied by the sum of the weights of the directed edges constituting the directed cycle is that the sum of the weights is larger than 0.

According to another implementation of the present invention, if the directed edges point to nodes at which signal arrives at an early time, the condition required to be satisfied by the sum of the weights of the directed edges constituting the directed cycle is that the sum of the weights is smaller than 0.

According to a still further implementation of the present invention, the searching module 1203 further comprises a strongly connected component searching module (not shown in the figure) for searching for all the strongly connected components of the directed graph.

In the present invention, weight of the directed edge is Minimum Required Time Advanced of signal arrival of two nodes connected by that directed edge.

Although exemplary embodiments of the present invention are described herein with reference to the figures, it shall be appreciated that the present invention is not limited to these precise embodiments, and various changes and modifications may be made to the embodiments by a person skilled in the art without departing from the scope and object of the present invention. All these changes and modifications are intended to be included within the scope of the present invention as defined in the appended claims.

In addition, according to the above description, as will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In addition, each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A method for detecting timing constraint conflicts, comprising:
   receiving a timing constraint file;
   taking all test points in the timing constraint file as nodes, determining directed edges between the nodes and weights of the directed edges according to timing constraints relevant to the test points in the timing constraint file to establish a directed graph which comprises:
   parsing general timing constraints, and taking all obtained test points as nodes, wherein the general timing constraints comprise at least one of implicit timing constraints and timing constraints given in the timing constraint file;
   obtaining directed edges between all the nodes and weights of the directed edges according to parsed general timing constraints; and
   forming a directed graph by using all the nodes, the directed edges and the weights on the directed edges;
   searching for all directed cycles of the directed graph; and
   for each directed cycle, after determining that the sum of the weights of the directed edges constituting the directed cycle satisfies a required condition, determining that a timing constraint conflict exists among the test points and the timing constraints constituting the directed cycle;
   wherein the method is performed by one or more computer processors.

2. The method as recited in claim 1, wherein the weight of a directed edge is Minimum Required Time Advanced of signal arrival of two nodes connected by that directed edge.

3. The method as recited in claim 1 or 2, wherein taking the test points in the timing constraint file as nodes further comprises:
   determining whether information of all the test points in the timing constraint file are complete; and
   after determining that information of part of the test points are incomplete, conducting a retrieval in a netlist to obtain complete information of the part of the test points.

4. The method as recited in claim 1, wherein parsing general timing constraints comprises:
   retrieving implicit timing constraints in the netlist, the implicit timing constraints are defined by devices used in the netlist and are not given in the timing constraint file; and
   combining the implicit timing constraints with the timing constraints given in the timing constraint file to form general timing constraints.

5. The method as recited in claim 1 or 2, wherein after determining that the directed edges point to nodes at which signal arrives at a late time, the condition required to be satisfied by the sum of the weights of the directed edges constituting the directed cycle is that the sum of the weights is larger than 0.

6. The method as recited in claim 1 or 2, wherein after determining that the directed edges point to nodes at which signal arrives at an early time, the condition required to be satisfied by the sum of the weights of the directed edges constituting the directed cycle is that the sum of the weights is smaller than 0.

7. The method as recited in claim 1 or 2, wherein searching for all directed cycles of the directed graph comprises searching for all strongly connected components of the directed graph.

8. The method as recited in claim 1 or 2, further comprising: outputting the test points and timing constraints constituting the directed cycle among which the timing constraint conflict exists.

9. An apparatus for detecting timing constraint conflicts, comprising:
   a receiving module for receiving a timing constraint file;
   an establishing module for, taking all test points in the timing constraint file as nodes, determining directed edges between the nodes and weights of the directed edges according to timing constraints relevant to the test points in the timing constraint file to establish a directed graph, the establishing module comprises:
   a parsing module for parsing general timing constraints, and taking all obtained test points as nodes, wherein the general timing constraints comprise at least one of implicit timing constraints and timing constraints given in the timing constraint file;
   a directed edge and weight establishing module for obtaining directed edges between all the nodes and weights of the directed edges according to parsed general timing constraints; and
   a directed graph establishing module for forming a directed graph by using all the nodes, the directed edges and the weights on the directed edges;
   a searching module for searching for all directed cycles of the directed graph; and
   a determining module for, for each directed cycle, after determining that the sum of the weights of the directed edges constituting the directed cycle satisfies a required condition, determining that a timing constraint conflict exists among the test points and the timing constraints constituting the directed cycle.

10. The apparatus as recited in claim 9, wherein the weight of a directed edge is Minimum Required Time Advanced of signal arrival of two nodes connected by that directed edge.

11. The apparatus as recited in claim 9 or 10, wherein the establishing module comprises:
   a judging module for judging whether information of all the test points in the timing constraint file are complete; and
   a netlist retrieval module for, if information of part of the test points are incomplete, conducting a retrieval in the netlist to obtain complete information of the part of the test points.

12. The apparatus as recited in claim 10, wherein the parsing module comprises:
   a netlist retrieval module for retrieving implicit timing constraints in the netlist, the implicit timing constraints are defined by devices used in the netlist and are not given in the timing constraint file; and a combining module for combining the implicit timing constraints with the timing constraints given in the timing constraint file to form general timing constraints.

13. The apparatus as recited in claim 9 or 10, wherein if after determining that the directed edges point to nodes at which signal arrives at a late time, the condition required to be satisfied by the sum of the weights of the directed edges constituting the directed cycle is that the sum of the weights is larger than 0.

14. The apparatus as recited in claim 9 or 10, wherein if after determining that the directed edges point to nodes at which signal arrives at an early time, the condition required to be satisfied by the sum of the weights of the directed edges constituting the directed cycle is that the sum of the weights is smaller than 0.

15. The apparatus as recited in claim 9 or 10, wherein the searching module comprises: a strongly connected component searching module for searching for all strongly connected components of the directed graph.

16. The apparatus as recited in claim 9 or 10, further comprising:
an outputting module for outputting the test points and timing constraints constituting the directed cycle among which the timing constraint conflict exists.

* * * * *